US006021561A

United States Patent [19]

Shimamura et al.

[11] Patent Number: 6,021,561

[45] Date of Patent: Feb. 8, 2000

[54] CONNECTION PIN HANDLING DEVICE SELECTIVELY INSERTING OR EXTRACTING A CONNECTION PIN

[75] Inventors: Koichi Shimamura; Junzo Une; Rie Sumino, all of Kawasaki, Japan

[73] Assignee: Fujitsu Limited, Kawasaki, Japan

[21] Appl. No.: 08/848,729

[22] Filed: May 22, 1997

[30] Foreign Application Priority Data

May 22, 1996 [JP] Japan .................................. 8-127232

[51] Int. Cl.[7] ............................................ H05K 3/32

[52] U.S. Cl. .......................................... 29/741; 29/739

[58] Field of Search .............................. 29/739, 741

[56] References Cited

U.S. PATENT DOCUMENTS 4,611,397 9/1986 Janisiewicz et al. .................... 29/834

5,160,877 11/1992 Fujiwara et al. .................. 318/568.21

*Primary Examiner*—Lee Young

*Assistant Examiner*—Rick Kiltae Chang

*Attorney, Agent, or Firm*—Staas & Halsey LLP

[57] ABSTRACT

A connection pin handling device has first and second sleeves mounted on a common axis and having corresponding first and second inlets disposed respectively at first and second opposite sides of the device, each inlet alignable with a selected connection pin on the corresponding side of the device. First and second push rods are slidably mounted for movement along the common axis in the first and second sleeves, respectively, to engage, by a selected one of the first and second push rods, a selected, aligned connection pin disposed at the respective, corresponding side of the connection pin handling device. A spring is disposed between the first and second push rods and exerts an insertion force on the selected push rod which applies a force to, and moves, the selected connection pin engaged thereby for performing an insertion or an extraction operation thereon.

12 Claims, 9 Drawing Sheets

FIG. 6A
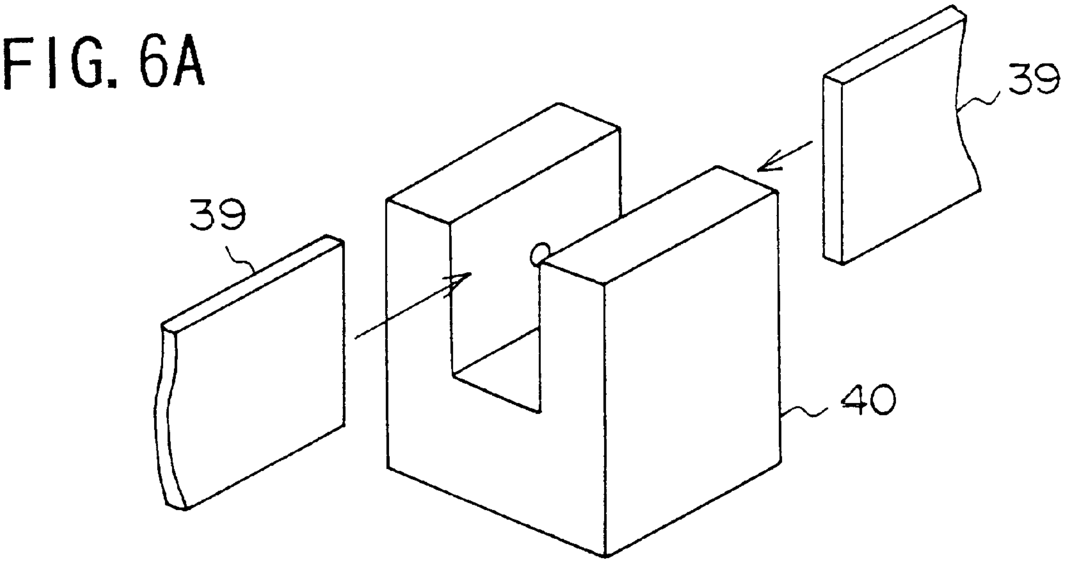
FIG. 6B
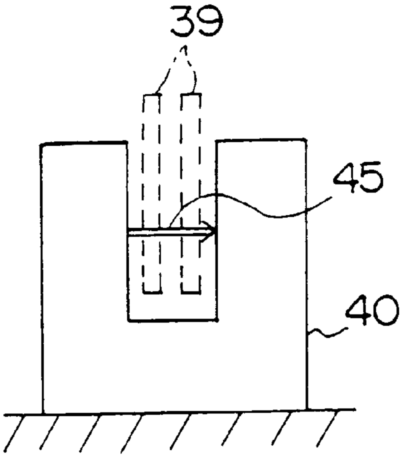
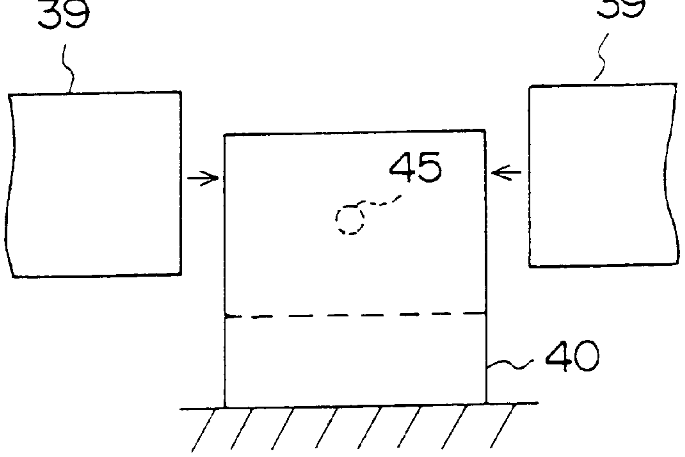
FIG. 6C

WAVEFORM OF PHOTOELECTRIC SWITCH OUTPUT

CONNECTION PIN HANDLING DEVICE SELECTIVELY INSERTING OR EXTRACTING A CONNECTION PIN

CROSS REFERENCE TO RELATED APPLICATION

The subject matter of the present application is related to that of application Ser. No. 08/662,011 of Toshihiro SUZUKI et al. entitled AUTOMATIC LINE DISTRIBUTION EQUIPMENT AND CONNECTION-PIN INSERTING-AND-EXTRACTING APPARATUS filed Jun. 12, 1996.

BACKGROUND OF THE INVENTION

1. Field of the Invention

The present invention generally relates to a connection pin handling device which selectively inserts or extracts a connection pin (hereinafter, insertion/extraction devices) and methods for selectively inserting or extracting a connection pin (hereinafter, inserting/extracting a connection pin). More particularly, the present invention relates to a connection pin insertion/extraction device and a method using the device in which an arbitrary line is connected/disconnected by inserting/extracting a connection pin into/from a matrix switch board.

Recently, demands have been increased for convenient methods for obtaining a telephone circuit by connecting/disconnecting conductor patterns at arbitrary points in the field of telephone switchboards. In one such method, which is currently dominating the field, a connector pin is inserted in a crossing point of a plurality of conductor patterns formed on a matrix switch board.

In the above method, the matrix switch board includes a plurality of conductor patterns located on both sides so as to cross over each other at the same coordinate. The connection between the conductor patterns is carried out by inserting a cross-shaped connection pin having two metallic protruding portions into a through-hole provided with a crossing point.

Also, the connection between the conductor patterns may be disconnected by extracting the connection pin inserted in the through-hole. The insertion/extraction operation of the connection pin may be automatically carried out by a robot, which is controlled by a computer, comprising a connection pin insertion/extraction device. It is necessary to accurately detect the position of the through-hole relative to the robot in order to precisely insert the connection pin in the through-hole. Thus, a position detection mechanism may necessarily be provided with the robot.

The above-mentioned connection pin insertion/extraction device may be applied to, for example, an automatic line distribution equipment which connects a switch board line with a subscriber line. In this case, two conductor patterns are used as the switch board line and the subscriber line, respectively. One of the switch board lines may be connected to one of the subscriber lines by inserting the connection pin in a through-hole formed at a crossing point of the two conductor patterns.

FIGS. 1A and 1B are diagrams showing the structure of a conventional connection pin insertion/extraction device. FIG. 1A is a diagram showing a front view of the device and FIG. 1B is a diagram showing a side view of the device. The connection pin insertion/extraction device shown in the figures may be mounted on an arm of a robot 1, which is capable of moving in the X, Y and Z directions, so that the device may be freely transferred between two matrix switch boards 2. In each of the matrix switch boards 2, a plurality of conductor patterns are formed so as to cross each other, and a corresponding through-hole is formed at a crossing point of the conductor patterns. The connection pin insertion/extraction device inserts a connection pin 3 in the through-hole formed in the matrix switch board 2 so as to connect the conductor patterns.

The connection pin insertion/extraction device shown in FIG. 1A and 1B is comprised of an optical sensor 4, a handling mechanism 5, an insertion-strength restriction mechanism 6 and a reversal mechanism 7.

The optical sensor 4, which is mounted on the handling mechanism 5, irradiates a laser beam from a laser port 4*a* onto a standard mark formed on the matrix switch board 2 and determines a positional relationship between the connection pin insertion/extraction device and the matrix switch board by detecting the strength of reflected laser light from the standard mark.

FIG. 2 is a diagram for explaining a detection method of the standard mark by the optical sensor 4. A standard mark 2*a* which has a high reflectivity is provided near a through-hole formed on the matrix switch board 2. In this case, the positional relationship between the through-hole and the standard mark 2*a* may be accurately determined by using the same patterning mask for the through-hole and the standard mark 2*a*.

The optical sensor 4 irradiates a laser beam onto a region of the standard mark 2*a* while moving in the directions indicated by the arrows in FIG. 2. At this time, the position of the standard mark 2*a* is determined by detecting the border lines between the standard mark 2*a* and the matrix switch board 2 from the strength of the reflected laser beam. Since the positional relationship between the standard mark 2*a* and the through-hole is accurately defined, the positional relationship between the through-hole and the robot may also be precisely determined.

As shown in FIG. 1A, the handling mechanism 5 is comprised of two rotary hooks 5*a*, a push rod 5*b* and an electromagnet 5*c*. The handling mechanism 5, which may be mounted on the insertion-strength restriction mechanism 6, carries out a holding/releasing operation of the connection pin 3. For example, the handling mechanism 5 with the rotary hooks 5*a* opened may be moved to the connection pin 3 and when it contacts the pin 3, the push rod 5*b* starts to move upward in the figure.

As the push rod 5*b* moves upward, a flange 5*d* which is formed on the push rod 5*b* closes the rotary hooks 5*a*, and at the same time, the push rod 5*b* contacts the electromagnet 5*c*. When the push rod 5*b* contacts the electromagnet 5*c*, the electromagnet is magnetized and the connection pin 3 is held by the rotary hooks 5*a*. Thus, the connection pin 3 may be extracted from the through-hole by moving the handling mechanism 5 in the upward direction.

The insertion-strength restriction mechanism 6 is operated so as to restrict the insertion strength of the connection pin 3 when the pin 3 is inserted in a through-hole. For instance, a certain force is required for inserting the connection pin 3 in the matrix switch board 2. However, the connection pin 3 may be damaged if too much force is applied to the pin 3. Therefore, a mechanism by which the insertion strength of the pin 3 may be restricted is necessarily provided with the connection pin insertion/extraction device.

The insertion-strength restriction mechanism 6, which is mounted between the handling mechanism 5 and the reversal mechanism 7, may be comprised of an insertion-strength generating spring 6*a*, a slider 6*b*, a rail 6*c*, a sensor 6*d* and a masking plate 6*e*. The rail 6*c* is fixed to the robot 1 via the reversal mechanism 7, and the handling mechanism 5 is mounted on a side surface of the slider 6*b*. The masking plate 6*e* is fixed on the upper surface of the slider 6*b* so that it may be moved with the slider 6*b* in the up and down directions. Also, the insertion-strength generating spring 6*a*, which is provided on the upper surface of the slider 6*b*, generates a stress (insertion strength) when the slider 6*b* moves in the up and down directions.

A light beam is ejected in the transverse direction in the sensor 6*d*. The sensor 6*d* determines a movement of the slider 6*b* when the slider 6*b* moves in the up or down direction and the masking plate 6e interrupts the light beam. That is, the sensor 6*d* detects that the insertion-strength generating spring 6*a* is contracted by a predetermined distance. The insertion-strength generating spring 6*a* is formed so that its insertion strength reaches a maximum limit when it is contracted by the predetermined distance in the above operation.

When the robot 1 is moved to a through-hole in order to insert the connection pin 3, the rail 6*c* and the slider 6*b* move in the downward direction in the figure. When the connection pin 3 starts to contact the through-hole, the insertion-strength generating spring 6*a* is deflected and generates an insertion force which is appropriate for inserting the connection pin 3 in the through-hole. After that, the robot 1 continues its movement and when the sensor 6*d* which is mounted on the rail 6*c* detects the masking plate 6*e* of the slider 6*d*, the insertion strength applied to the connection pin 3 reaches maximum and the insertion operation is terminated.

The reversal mechanism 7, which is provided between the insertion-strength restriction mechanism 6 and the robot 1, rotates the optical sensor 4, the handling mechanism 5 and the insertion-strength restriction mechanism 6 by 180 degrees so as to enable a both-side insertion/extraction of the connection pin 3.

However, according to the conventional connection pin insertion/extraction devices, the position of a through-hole is determined relative to the standard mark 2*a* on the matrix switch board, which is detected by the light beam. Thus, it is required to provide, additionally, the optical sensor 4 which optically detects the standard mark 2*a* with the connection pin insertion/extraction device. Also, it is necessary to additionally provide the reversal mechanism 7 with the connection pin insertion/extraction device in order to perform an insertion/extraction operation of the connection pin 3 for both sides of the matrix switch board.

Accordingly, it is not easy to reduce the size and the manufacturing cost of the conventional connection pin insertion/extraction device.

Moreover, in the conventional connection pin insertion/extraction device, since the optical sensor 4, which forms a position detection mechanism, is provided a certain distance away from the position of a connection pin, it is necessary to correct the position of a through-hole corresponding to the distance. This may become one of the error factors in the through-hole position detection operation and may cause an erroneous insertion of the connection pin.

SUMMARY OF THE INVENTION

It is a general object of this invention to provide a connection pin insertion/extraction device in which the above-mentioned problems are eliminated.

It is also a general object of this invention to provide a method for inserting/extracting a connection pin by which the above-mentioned problems are eliminated.

A more specific object of the present invention is to provide a connection pin insertion/extraction device of reduced size which may be manufactured at low cost.

It is another object of the present invention to provide a connection pin insertion/extraction device by which a position of an object may be detected with high accuracy.

It is still another object of the present invention to provide a method for inserting/extracting a connection pin by which a position of a through-hole may be accurately detected and a connection pin may be precisely inserted therein.

The objects described above are achieved by a connection pin insertion/extraction device comprising: two sleeves, each of the sleeves being provided on the same axis and having an inlet facing the outside of the connection pin insertion/extraction device so as to be engaged with a connection pin; two push rods, each of the push rods being slidably provided in one of the corresponding sleeves so as to push the connection pin; and a spring provided between the two push rods which spring generates an insertion force for the connection pin, whereby the connection pin insertion/extraction device performs an insertion/extraction operation of the connection pin on both sides of the connection pin insertion/extraction device.

The objects described above are also achieved by the connection pin insertion/extraction device further provided with two hooks, each one of the hooks being provided around the axis so as to enable the hooks to hold the connection pin.

According to the above connection pin insertion/extraction device, it is possible to carry out an insertion/extraction operation for the connection pin for both sides of the connection pin insertion/extraction device without using a reversal mechanism which is usually used in a conventional connection pin insertion/extraction device. Also, since the hooks and the spring may be shared by a handling mechanism for handing the connection pin at right and left hand sides, the size of the device may be decreased and the cost required for constructing the device may be reduced.

The objects described above are also achieved by the connection pin insertion/extraction device, wherein the two hooks are formed as one member which moves parallel with respect to a vertical direction of the axis and may perform an opening/closing operation on a respective side of the connection pin insertion/extraction device.

According to the above device, since the two hooks are formed as one member and performs an opening/closing operation on both sides of the connection pin insertion/extraction device, it is possible to perform an insertion/extraction operation for the connection pin for both sides of the device without using a reversal mechanism which is usually used in a conventional device. Also, since the hooks and the spring may be shared by a handling mechanism for handing the connection pin at right and left hand sides, the size of the device may be decreased and the cost required for constructing the device may be reduced.

The objects described above are also achieved by the connection pin insertion/extraction device, further comprising: a detection portion which detects a sliding distance of the two push rods, the detection portion including a first member which is fixed to the back portion of one of the two push rods; a second member which is fixed to the back portion of the other one of the two push rods; and a first circuit which outputs different signals in accordance with the movement of one of the first member and the second member, wherein the movement of the push rod for pushing the connection pin may be stopped by a signal from the first circuit when the push rod is moved a first predetermined distance, and a presence of an object may be detected by a signal from the first circuit when the push rod is moved a second predetermined distance after the push rod contacts the object.

According to the above device, an insertion force applied to a connection pin by the push rod may be controlled by the push rod, the spring and the detection portion and the presence of an object may also be detected. That is, an insertion force restriction mechanism and a position detection mechanism may be formed by using the identical construction parts. Also, a part (the push rod and the spring) of the mechanism may be included in the handling mechanism. Thus, the size and the cost of the connection pin insertion/extraction device may be reduced compared with a conventional connection pin insertion/extraction device in which the insertion force restriction mechanism and the position detection mechanism are independently added thereto.

The objects described above are also achieved by the connection pin insertion/extraction device, wherein the two sleeves, the two push rods, the spring, and the two hooks form a connection pin handling mechanism, and the two push rods, the spring, and the detection portion form a monitor mechanism which monitors an insertion strength of the two push rods and a presence of the object, the connection pin handling mechanism and the monitor mechanism being provided on substantially the same axis.

According to the above device, the monitor mechanism comprising the two push rods, the spring, and the detection portion and the handling mechanism are provided on substantially the same axis. That is, the insertion force restriction mechanism and the position detection mechanism, each of which forms the monitor mechanism, are formed on substantially the same axis of the handling mechanism. Thus, the insertion force may be transmitted efficiently without loss and an error associated with a position detection operation may be reduced.

The objects described above are also achieved by the connection pin insertion/extraction device, wherein each of the first member and the second member is formed of a masking plate, and the first circuit included in the detection portion is comprised of a photoelectric switch using a light beam, wherein the light beam may be interrupted by the movement of the first member and the movement of the second member so that the photoelectric switch may output different signals in accordance with the movement of the two push rods.

According to the above device, the detection portion may be formed by using simple construction parts. Thus, the size and the cost of the connection pin insertion/extraction device may be reduced.

The objects described above are also achieved by the connection pin insertion/extraction device, wherein each of the first member and the second member is formed of a dog, and the first circuit included in the detection portion is comprised of a mechanical switch, wherein the mechanical switch may be actuated by the movement of the first member and the movement of the second member so that the mechanical switch may output different signals in accordance with the movement of the two push rods.

According to the above device, the detection portion may be formed by using simple construction parts. Thus, the size and the cost of the connection pin insertion/extraction device may be reduced.

The objects described above are achieved by a connection pin insertion/extraction device comprising: a sleeve which is provided with an inlet facing the outside of the connection pin insertion/extraction device so as to be engaged with a connection pin; a push rod which is slidably provided in the sleeve so as to push the connection pin; a spring which generates an insertion force for the connection pin by pushing the push rod; a hook being provided around a central axis of the sleeve so as to enable the hook to hold the connection pin; and a detection portion which detects a sliding distance of the push rod, the detection portion including a first member, which is fixed to the back portion of the push rod, and a first circuit, which outputs different signals in accordance with the movement of the first member, wherein the movement of the push rod for pushing the connection pin may be stopped by a signal from the first circuit when the push rod is moved a first predetermined distance, and a presence of an object may be detected by a signal from the first circuit when the push rod is moved a second predetermined distance after the push rod contacts the object.

According to the above device, an insertion force applied to a connection pin by the push rod may be controlled by the push rod, the spring and the detection portion and the presence of an object may also be detected. That is, an insertion force restriction mechanism and a position detection mechanism may be formed by using the identical construction parts. Also, a part (the push rod and the spring) of the mechanism may be included in a handling mechanism. Thus, the size and the cost of the connection pin insertion/extraction device may be reduced compared with a conventional connection pin insertion/extraction device in which the insertion force restriction mechanism and the position detection mechanism are independently added thereto.

The objects described above are also achieved by the connection pin insertion/extraction device, wherein the sleeve, the push rod, the spring, and the hook form a connection pin handling mechanism, and the push rod, the spring, and the detection portion form a monitor mechanism which monitors an insertion strength of the push rod and a presence of the object, the connection pin handling mechanism and the monitor mechanism being provided on substantially the same axis.

According to the above device, the monitor mechanism comprising the push rod, the spring and the detection portion and the handling mechanism are provided on substantially the same axis. That is, the insertion force restriction mechanism and the position detection mechanism, each of which forms the monitor mechanism, are formed on substantially the same axis of the handling mechanism. Thus, the insertion force may be transmitted efficiently without loss and an error associated with a position detection operation may be reduced.

The objects described above are also achieved by the connection pin insertion/extraction device, wherein the first member is formed of a masking plate, and the first circuit included in the detection portion is comprised of a photoelectric switch using a light beam, wherein the light beam may be interrupted by the movement of the first member so that the photoelectric switch may output different signals in accordance with the movement of the push rod.

According to the above device, the detection portion may be formed by using simple construction parts. Thus, the size and the cost of the connection pin insertion/extraction device may be reduced.

The objects described above are also achieved by the connection pin insertion/extraction device, wherein the first member is formed of a dog, and the first circuit included in the detection portion is comprised of a mechanical switch, wherein the mechanical switch may be actuated by the movement of the first member so that the mechanical switch may output different signals in accordance with the movement of the push rod.

According to the above device, the detection portion may be formed by using simple construction parts. Thus, the size and the cost of the connection pin insertion/extraction device may be reduced.

The objects described above are achieved by a method for inserting a connection pin in a through-hole formed on a board using a connection pin insertion/extraction device comprising steps of: (a) moving the connection pin insertion/extraction device holding the connection pin by a hook towards the board so as to push the connection pin to the board; (b) stopping the movement of the connection pin insertion/extraction device in response to a change in a signal from a first circuit so as to apply an insertion force not greater than a predetermined value to the connection pin; (c) opening the hook; and (d) moving the connection pin insertion/extraction device backward, wherein the connection pin insertion/extraction device comprises: at least one push rod which is slidably formed and pushes the connection pin towards the board with an insertion strength corresponding to a sliding distance thereof; at least one hook which is capable of holding the connection pin; a first member which is fixed to the back portion of the corresponding at least one push rod; and a detection portion which detects a sliding distance of the push rod, the detection portion including the first circuit which outputs different signals in accordance with the movement of the first member.

According to the above method, an insertion force larger than a predetermined value is not applied to a connection pin. Thus, it is possible to avoid a danger in which the connection pin is destroyed by an excessive insertion force.

The objects described above are achieved by a method for extracting a connection pin inserted in a through-hole formed on a board using a connection pin insertion/extraction device comprising steps of: (a) moving the connection pin insertion/extraction device including an opened hook towards the connection pin inserted in the board so as to push the connection pin by a push rod which slides in an opposite direction to the board upon contact with the connection pin; (b) stopping the movement of the connection pin insertion/extraction device in response to a change in a signal from a first circuit of a detection portion which is caused by the movement of a first member fixed to the push rod so that the connection pin insertion/extraction device stops at an appropriate position for holding the connection pin by the hook; (c) closing the hook; and (d) moving the connection pin insertion/extraction device backward so as to extract the connection pin from the board, wherein the connection pin insertion/extraction device comprises: at least one push rod which is slidably formed and pushes the connection pin towards the board with an insertion strength corresponding to a sliding distance thereof; at least one hook which is capable of holding the connection pin; and a detection portion which detects a sliding distance of the push rod, the detection portion including the first member which is fixed to the back portion of the corresponding at least one push rod and the first circuit which outputs different signals in accordance with the movement of the first member.

According to the above method, the connection pin insertion/extraction device is controlled to stop at an appropriate position for the hook to hold a connection pin. Thus, it is possible to prevent a collision of the hooks with a board. Also, the hook may properly hold the connection pin.

The objects described above are achieved by a method for detecting the presence and position of an object on a board using a connection pin insertion/extraction device comprising steps of: (a) moving the connection pin insertion/extraction device above the object with a predetermined pitch; and (b) contacting a push rod to the object by moving the connection pin insertion/extraction device a predetermined distance in up and down directions with respect to the board for every movement of the connection pin insertion/extraction device with the predetermined pitch, wherein the presence of the object is detected by the change in signal from a first circuit of a detection portion, which is caused by the movement of a first member of the detection portion when the push rod contacts the object, and the position of the object is determined by measuring a transfer distance of the connection pin insertion/extraction device, the connection pin insertion/extraction device comprising: at least one push rod which is slidably formed and pushes the connection pin towards the board with an insertion strength corresponding to a sliding distance thereof; the detection portion which detects the sliding distance of the push rod, the detection portion including the first member which is fixed to the back portion of the push rod and the first circuit which outputs different signals in accordance with the movement of the first member, and a transfer distance measurement portion which measures a transfer distance of the connection pin insertion/extraction device.

According to the above method, the presence and the position of an object may be detected by making the push rod contact the object. Thus, the accurate position of a through-hole may be detected by making the push rod contact a standard pin when the standard pin is provided on a board with a predetermined positional relationship to the through-hole.

The objects described above are achieved by a method for detecting the position of a connection pin insertion/extraction device in a height direction on a board comprising steps of: (a) setting the current position of the connection pin insertion/extraction device as a base position; and (b) contacting a push rod to the board by moving the connection pin insertion/extraction device towards the board, wherein a first member of a detection portion is moved when the push rod contacts the board so as to change the output from a first circuit of the detection portion, and the distance between the connection pin insertion/extraction device and the board is determined by measuring the transfer distance of the connection pin insertion/extraction device, the connection pin insertion/extraction device comprising: at least one push rod which is slidably formed and pushes the connection pin towards the board with an insertion strength corresponding to a sliding distance thereof; a detection portion which detects a sliding distance of the push rod, the detection portion including the first member which is fixed to the back portion of the push rod and the first circuit which outputs different signals in accordance with the movement of the first member, and a transfer distance measurement portion which measures a transfer distance of the connection pin insertion/extraction device.

According to the above method, the distance between the connection pin insertion/extraction device and the board may be accurately measured by making the push rod contact the board.

The objects described above are achieved by a method for detecting a failure of an insertion/extraction operation for a connection pin by a connection pin insertion/extraction device comprising steps of: (a) storing a position of the connection pin insertion/extraction device at which the output from a first circuit of a detection portion is changed in a normal insertion/extraction operation in advance, and (b) comparing the position of the connection pin insertion/extraction device at which the output from the first circuit is changed with the position stored in the step (a), wherein an insertion/extraction operation is determined to be a failure when an error larger than a predetermined value is detected in the step (b), the connection pin insertion/extraction device comprising: at least one push rod which is slidably formed and pushes the connection pin towards the board with an insertion strength corresponding to a sliding distance thereof; at least one hook which is capable of holding the connection pin; a detection portion which detects a sliding distance of the push rod, the detection portion including the first member which is fixed to the back portion of the push rod and the first circuit which outputs different signals in accordance with the movement of the first member, and a transfer distance measurement portion which measures a transfer distance of the connection pin insertion/extraction device.

According to the above method, it is possible to determine if an insertion or extraction operation of the connection pin insertion/extraction device is a failure or not by detecting the position of the connection pin insertion/extraction device at which the output from the first circuit is changed during the insertion or extraction operation.

Other objects and further features of the present invention will be apparent from the following detailed description when read in conjunction with the accompanied drawings.

BRIEF DESCRIPTION OF THE DRAWINGS

FIG. 6A is a diagram showing a perspective view of a detection portion of a monitor mechanism;

FIG. 6B is a diagram showing a side view of the detection portion of the monitor mechanism;

FIG. 6C a diagram showing a front view of the detection portion of the monitor mechanism;

DESCRIPTION OF THE PREFERRED EMBODIMENTS

A description will be given of embodiments according to the present invention with reference to the accompanied drawings.

Figure 3:
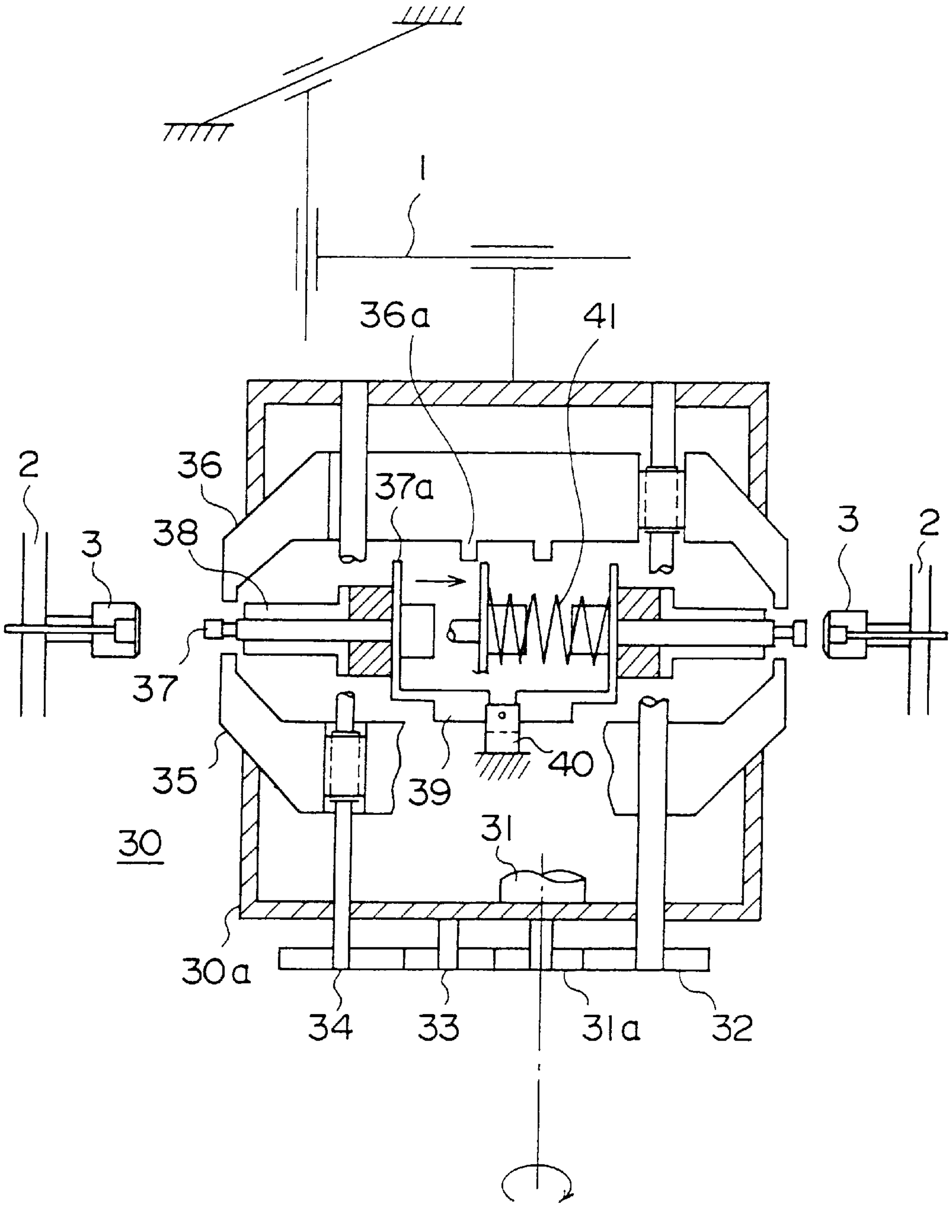
FIG. 3 is a structural diagram showing a connection pin insertion/extraction device according to the present invention.
Figure 4:
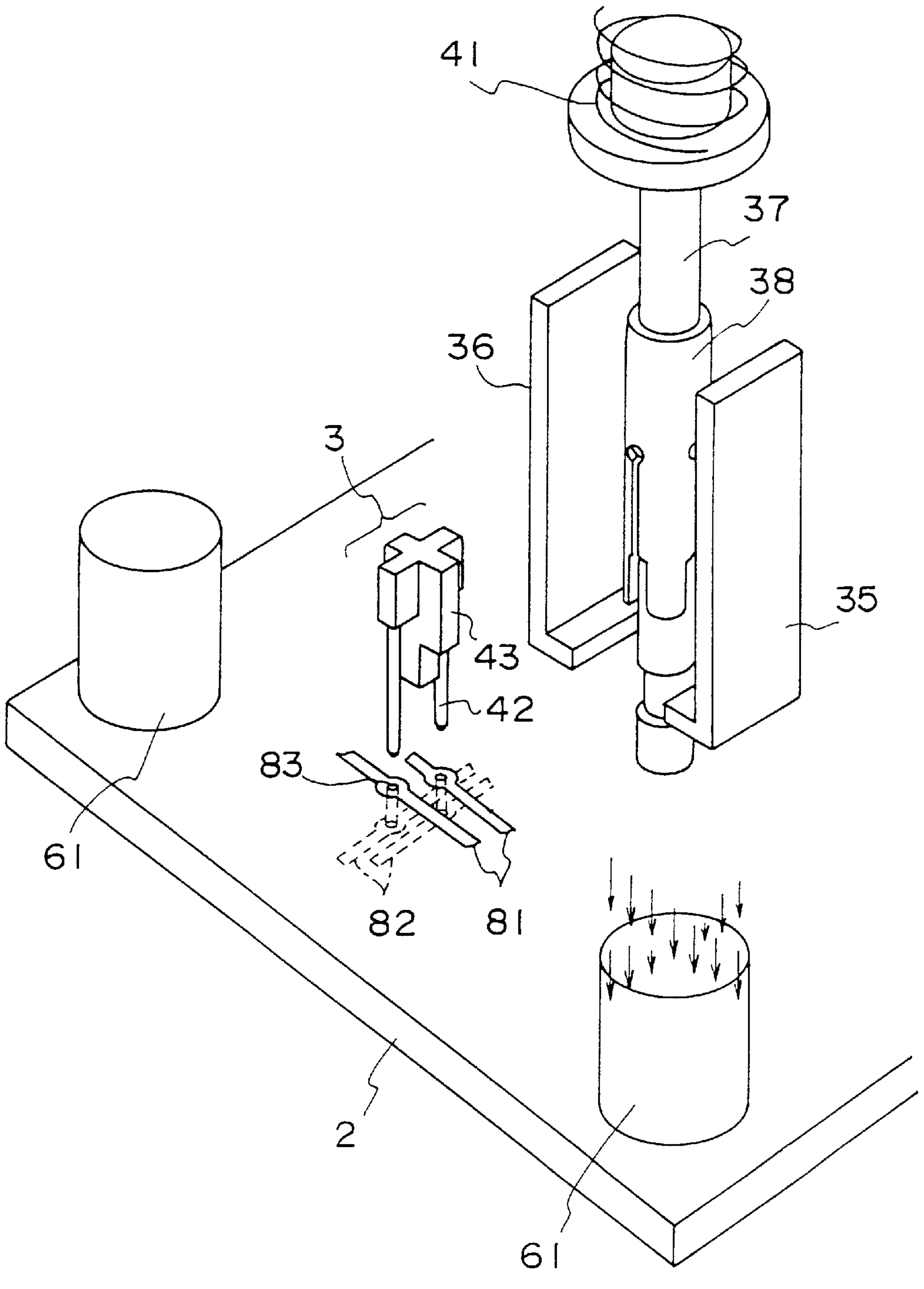
FIG. 4 is a diagram showing a portion of a handling mechanism of the connection pin insertion/extraction device shown in FIG. 3 in a magnified scale.

First, a handling mechanism of a connection pin insertion/extraction device according to the present invention will be explained with reference to FIGS. 3 through 5. FIG. 3 is a structural diagram showing a connection pin insertion/extraction device according to the present invention. FIG. 4 is a diagram showing a portion of a handling mechanism of the connection pin insertion/extraction device shown in FIG. 3 in a magnified scale. FIGS. 5A through 5E are diagrams for explaining an extraction operation of a connection pin by the connection pin insertion/extraction device according to the present invention. The operation of a monitor mechanism for a position detection mechanism and an insertion-strength restriction mechanism is also shown in FIGS. 5A through 5E.

In FIG. 3, it is shown that the connection pin insertion/extraction device according to the present invention is located between two matrix switch boards 2. The connection pin insertion/extraction device is mounted on an end of a robot 1 which may move in the X, Y, and Z directions. Thus, the connection pin insertion/extraction device may move freely between the two matrix switch boards 2.

The connection pin insertion/extraction device shown in FIG. 3 includes a handling mechanism 30 for handling a connection pin 3 at each of right and left hand sides. However, no reversal mechanism is provided with the connection pin insertion/extraction device. The handling mechanism 30 is mainly comprised of a frame 30*a*, screw shafts 32 and 34, hooks 35 and 36, a push rod 37 and a sleeve 38. The screw shafts 32 and 34 are supported by the frame 30*a* and the hooks 35 and 36 are moved by the screw shafts 32 and 34 in the up and down directions (i.e., as viewed in the orientation of FIG. 3). The push rod 37 contacts an object and the sleeve 38 is engaged with the connection pin 3.

A motor 31 is fixed to the frame 30*a* of the handling mechanism 30. The motor 31 drives the screw shafts 32 and 34 via a motor pinion 31*a* and an idler gear 33.

As shown in FIG. 4, the connection pin 3 is comprised of a base portion 43 of substantially a cross-shape and two pins 42 projecting from the base portion 43. The base portion 43 may be made of a resin while the two pins 42 may be made of a metal. The two pins 42 are electrically disconnected in the base portion 43.

Also, as shown in FIG. 4, conductor patterns 81 and 82 are provided on the upper surface and the lower surface, respectively, of the matrix switch board 2 so as to cross each other. In practice, the two conductive patterns 81 on the upper surface may be used for a subscriber line and the two conductive patterns 82 on the lower surface may be used for a switch board line. A through-hole 83 is formed in each crossing point of the conductor patterns 81 and 82.

Accordingly, the two conductor patterns on the upper surface and the two conductor patterns on the lower surface may be connected simultaneously by inserting the two pins 42 of the connection pin 3 in the two through-holes 83. That is, the subscriber line and the switch board line may be connected arbitrarily. On the other hand, the connected lines may be disconnected when the connection pin 3 is pulled out from the matrix switch board 2.

Next, an extraction operation of the connection pin 3 from the matrix switch board 2 will be explained in detail.

When the motor 31, which is fixed to the frame 30*a* of the handling mechanism 30, is rotated in the direction indicated by an arrow in FIG. 3, the rotating force generated is transferred to the screw shaft 32 via the motor pinion 31*a*. At this time, the direction of the rotating force applied to the screw shaft 32 is changed to opposite to be that of the motor 31, and hence the hook 36, in which the screw shaft 32 is driven, moves in the upward direction.

At the same time, the rotating force of the motor 31 is transferred to the screw shaft 34 via the idler gear 33. Since the rotating direction of the screw shaft 34 is the same as that of the motor 31, the hook 35, in which the screw shaft 34 is driven, moves in the downward direction. Thus, the hooks 35 and 36 are opened (refer to the state shown in FIG. 5A).

Figure 5A:
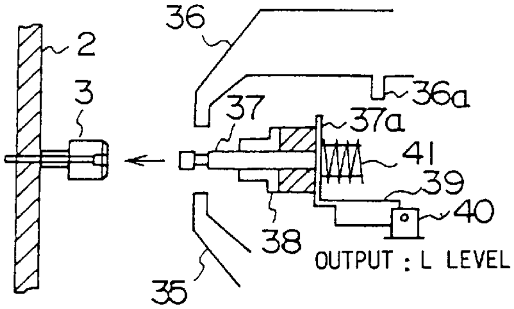
FIG. 5A is a diagram for explaining an extraction/insertion operation of a connection pin by the connection pin insertion/extraction device according to the present invention.
Figure 5D:
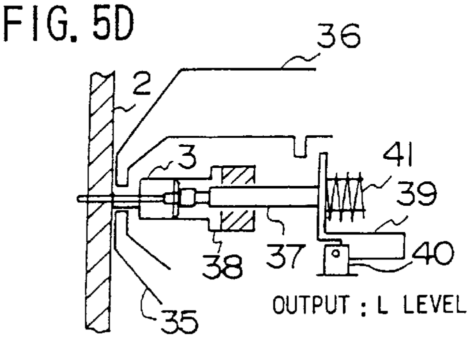
FIG. 5D is a diagram for explaining an extraction/insertion operation of a connection pin by the connection pin insertion/extraction device according to the present invention.
Figure 5B:
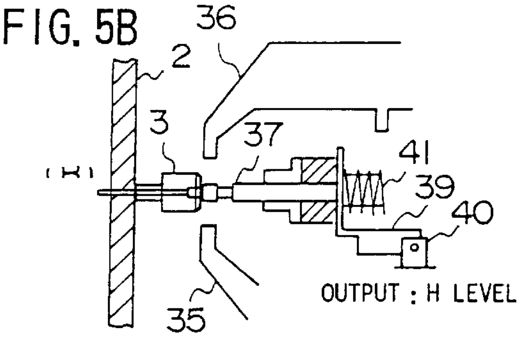
FIG. 5B is a diagram for explaining an extraction/insertion operation of a connection pin by the connection pin insertion/extraction device according to the present invention.

In this state, the push rod 37 contacts the connection pin 3 when the robot 1, on which the frame 30*a* of the handling mechanism 30 is mounted, is moved in the left direction (refer to FIG. 5B). At this time, the push rod 37 is pushed by the connection pin 3 and moves in the backward direction with a spring 41 being bent (compressed). As the handling mechanism 30 moves further toward the connection pin 3, the connection pin 3 having the base portion 43 of the cross-shape is contained in the sleeve 38 which includes a spring having a slit of a corresponding cross-shape (refer to FIG. 5C).

When the motor 31 is rotated in the opposite direction in this state, the hooks 35 and 36 are closed (refer to FIG. 5D) and, at the same time, a stopper 36*a* formed with the hook 36 is inserted, with a little spare space, on the left side of a flange 37*a* fixed to the other end of the push rod 37.

Figure 5E:
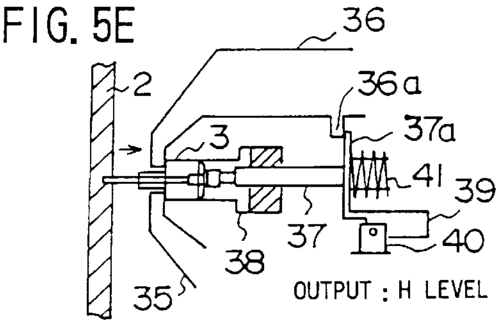
FIG. 5E is a diagram for explaining an extraction/insertion operation of a connection pin by the connection pin, insertion/extraction device according to the present invention.

When the robot 1 is moved in the right hand direction in this state, the base portion 43 of the connection pin 3 is hooked by the hooks 35 and 36 and the connection pin 3 may be extracted (refer to FIG. 5E). Also, since the flange 37*a* fixed to the push rod 37 is hooked by the stopper 36*a*, the push rod 37 is fixed with the spring 41 being compressed.

Although the extraction operation of the connection pin 3 inserted in the left-hand-side matrix switch board 2 is explained in the above, it is understood that the extraction operation of the connection pin 3 inserted in the right-hand-side matrix switch board 2 may be carried out in same manner. Also, the insertion operation of the connection pin 3 may be performed by reversing the above-mentioned extraction operation.

As mentioned above, according to the connection pin insertion/extraction device of the present invention, it is possible to carry out the insertion/extraction operation of the connection pin 3 for the matrix switch boards located on both sides of the device without using the reversal mechanism. Also, the hooks 35 and 36, the motor 31 and the spring 41 are commonly used or shared by the handling mechanism 30 for handing the connection pin 3 on the right and left hand sides. Thus, the number of construction parts for the device may be decreased and hence the manufacturing cost of the device may be lowered. Also, the size of the connection pin insertion/extraction device may be reduced.

Next, the insertion-strength restriction mechanism and the position detection mechanism of the connection pin insertion/extraction device according to the present invention will be described with reference to FIGS. 3 through 5.

Figures 1A, 1B:
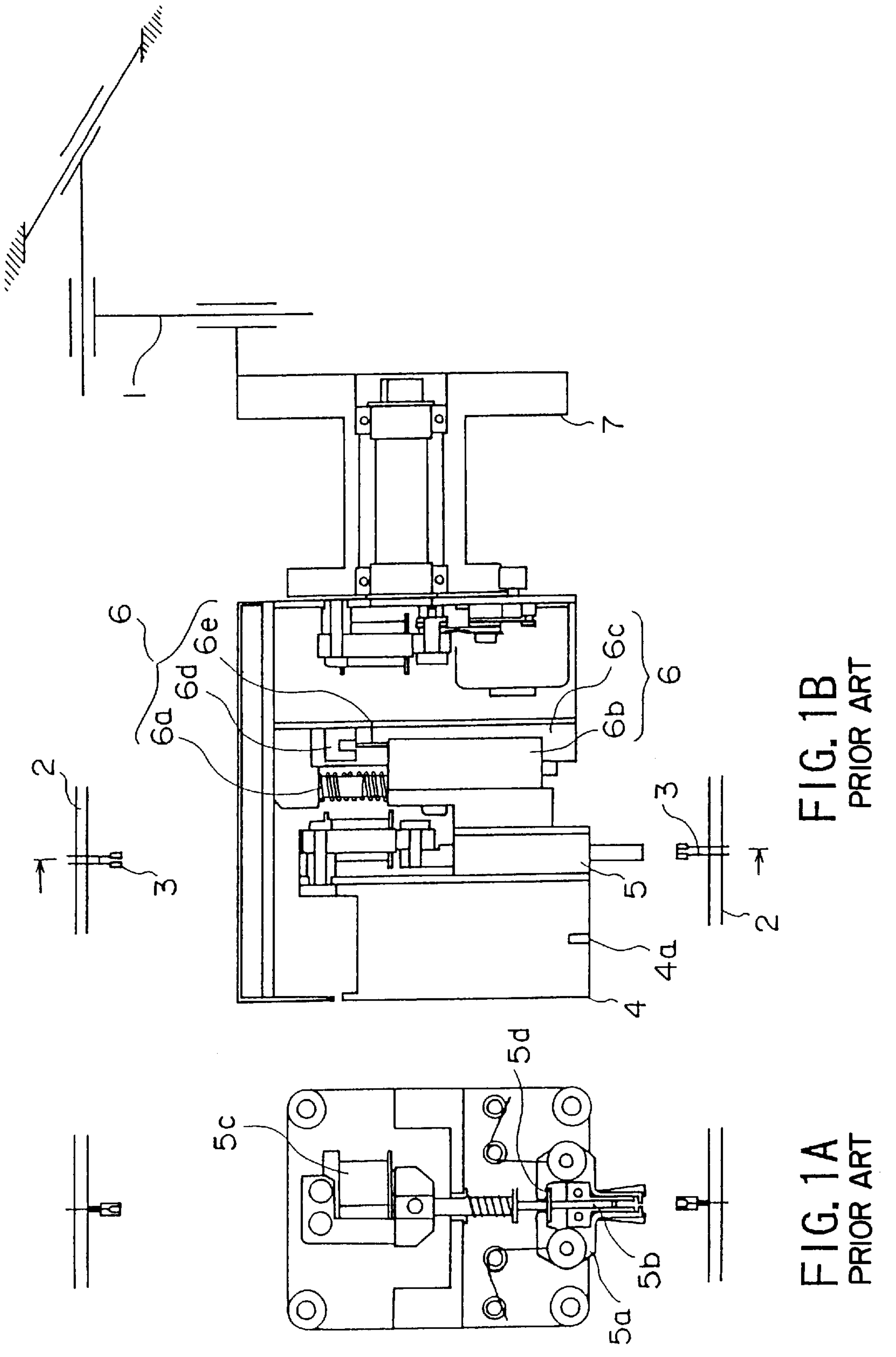
FIG. 1A PRIOR ART
FIG. 1B PRIOR ART
FIG. 1A is a diagram showing a front view of a conventional connection pin insertion/extraction device.
FIG. 1B is a diagram showing a side view of the conventional connection pin insertion/extraction device.
Figure 2:
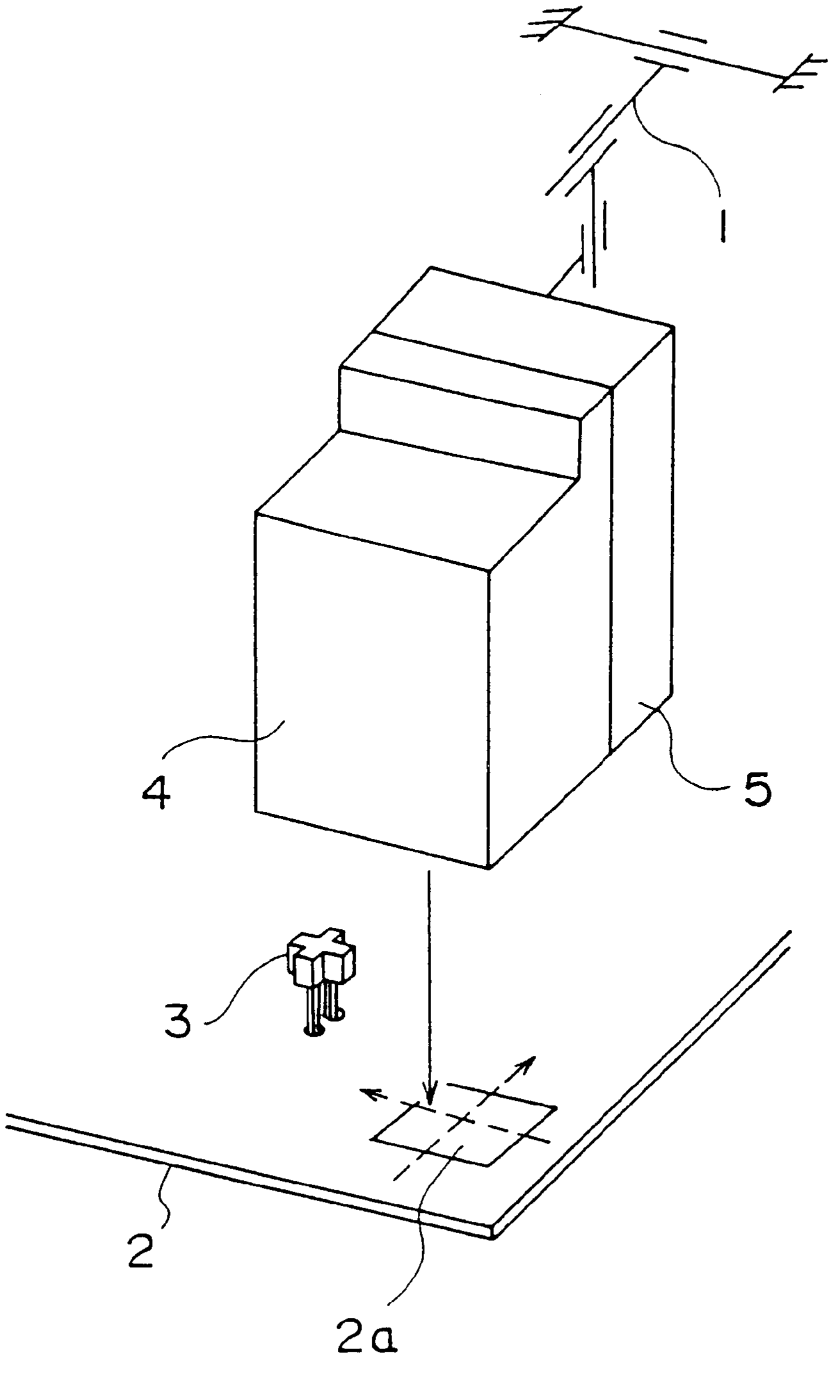
FIG. 2 PRIOR ART
FIG. 2 is a diagram for explaining a conventional detection method of a standard mark by an optical sensor of the connection pin insertion/extraction device.

In the conventional connection pin insertion/extraction device shown in FIG. 1, the insertion-strength restriction mechanism 6 and the optical sensor 4 (the position detection mechanism) are additionally provided with the handling mechanism of the device. However, according to the connection pin insertion/extraction device of the present invention, the insertion-strength restriction mechanism and the position detection mechanism are formed in the monitor mechanism and, moreover, a portion of the monitor mechanism is included in the above-mentioned handling mechanism 30. Also, the monitor mechanism is formed along substantially the same axis as that of the handling mechanism 30.

The monitor mechanism of the connection pin insertion/extraction device according to the present invention is comprised of two push rods 37, the spring 41, two masking plates 39 and a photoelectric switch 40. As shown in FIG. 3, the two push rods 37 are provided so as to oppose each other on the right and left hand sides of the device. The spring 41 is located between the two push rods 37 and the masking plate 39 is fixed to the back of each of the push rods 37. The masking plates 39 and the photoelectric switch 40 form a detection portion of the monitor mechanism. The push rods 37 and the spring 41 are commonly used in the above-mentioned handling mechanism 30 and the monitor mechanism.

The monitor mechanism monitors the insertion strength of the push rods 37 for the operation of the insertion-strength restriction mechanism and the presence of an object for the operation of the position detection mechanism.

The detection portion of the monitor mechanism comprised of the photoelectric switch 40 and the masking plates 39 will be described in detail with reference to FIGS. 6A through 6C. FIG. 6A is a diagram showing a perspective view of the detection portion of the monitor mechanism, FIG. 6B is a diagram showing a side view of the detection portion of the monitor mechanism, and FIG. 6C is a diagram showing a front view of the detection portion of the monitor mechanism.

As shown in the figures, the photoelectric switch 40 has a concave shape and a light beam 45 is ejected in the direction indicated by an arrow in FIG. 6B. The masking plates 39 are provided at right and left hand sides of the photoelectric switch 40 so as to be parallel to each other. Both of the right and left side masking plates 39 have a predetermined length.

When the push rods 37 move in the right and left directions, the two masking plates 39 cross the light beam 45 of the photoelectric switch 40 without contacting each other. When the light beam 45 of the photoelectric switch 40 is interrupted by the masking plates 39, a high-level signal (H-level signal) is output from the photoelectric switch 40.

On the other hand, a low-level signal (L-level signal) is output from the photoelectric switch 40 when the light beam 45 is not interrupted.

Next, the insertion-strength restriction mechanism of the connection pin insertion/extraction device according to the present invention will be explained.

In the connection pin insertion/extraction device shown in FIG. 3, the photoelectric switch 40 outputs a L-level signal when the push rods 37 are not in contact with anything (corresponds to the state shown in FIG. 5A). When the left-side push rod 37 starts to contact an object (corresponds to the state shown in FIG. 5B), the left-side masking plate 39 interrupts the light beam 45 and the photoelectric switch 40 outputs a H-level signal.

After that, when the push rods 37 are further pushed by the object (corresponds to the state shown in FIG. 5C), the left-side masking plate 39 having the predetermined length as mentioned above, passes over the light beam 45, and hence the signal level is changed to L from H. At this time, the push rods 37 receive a certain stress from the spring 41. The stress corresponds to the insertion strength for the connection pin 3 during an insertion operation.

In this state, when the movement of the push rods 37 are controlled so as to be stopped, the insertion strength exerted by the push rods 37 may be restricted to a predetermined value. Thus, the insertion strength greater than the predetermined value is not applied to the connection pin 3. The predetermined value may be determined by the property of the spring 41 and the position of the masking plates 39.

Figure 5C:
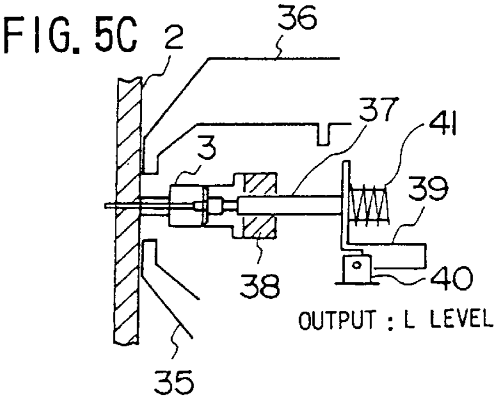
FIG. 5C is a diagram for explaining an extraction/insertion operation of a connection pin by the connection pin insertion/extraction device according to the present invention.

Next, an extraction operation of the connection pin 3 based on the output information from the photoelectric switch 40 will be explained with reference to FIGS. 5A through 5E. As mentioned above, in the state shown in FIG. 5A, the hooks 35 and 36 are opened and the robot 1 is moved to the matrix switch board 2. In the state shown in FIG. 5B, the output of the photoelectric switch 40 is changed to H-level from L-level. When the robot 1 is moved further, the output of the photoelectric switch 40 is changed to L-level from H-level as shown in FIG. 5C. At this moment, the robot 1 is stopped and the hooks 35 and 36 are closed as shown in FIG. 5D.

Then, as shown in FIG. 5E, the robot 1 is moved in the backward direction so that the connection pin 3 may be pulled out from the matrix switch board 2. At this time, the push rods 37 are moved toward the connection pin 3 relative to the frame 30*a* with a distance corresponding to the space between the flange 37*a* fixed to the push rods 37 and the stopper 36*a* formed with the hooks 35 and 36. Therefore, the output of the photoelectric switch 40 is changed to H-level again. This is the holding (handling) state of the connection pin 3.

Next, an insertion operation of the connection pin 3 based on the output information from the photoelectric switch 40 will be explained with reference to FIGS. 5A through 5E. The insertion operation of the connection pin 3 may be performed by reversing the above sequence for the extraction operation.

In the holding state of the connection pin 3 shown in FIG. 5E, the robot 1 is moved to the matrix switch board 2. When the connection pin 3 contacts the through-hole 83, the push rod 37 pushes the base portion 43 of the connection pin 3 with an insertion force obtained from the spring 41. The output of the photoelectric switch 40 is H-level in this state.

As shown in FIG. 5D, when the connection pin 3 is completely inserted in the through-hole, the push rod 37 moves to the opposite direction of the connection pin 3 with respect to the frame 30*a* and hence the output of the photoelectric switch 40 is changed to L-level from H-level. When this change of the output level is detected, the movement of the robot 1 is stopped. According to the above operation, it is possible to prevent the insertion force of the push rod 37 applied to the connection pin 3 from becoming greater than the predetermined limitation value. Thus, the danger that the connection pin 3 may be damaged by the applied insertion force may be eliminated according to the present invention.

Then, the hooks 35 and 36 are opened as shown in FIGS. 5C through 5A and the robot 1 is moved in the backward direction so that the insertion operation of the connection pin 3 may be completed. At this time, the output of the photoelectric switch 40 is changed to H-level from L-level and then changed to L-level from H-level. Thus, the termination of the insertion operation of the connection pin may be confirmed by the detection of the above change in the output level of the photoelectric switch 40.

Next, the position detection mechanism of the connection pin insertion/extraction device according to the present invention will be explained in detail. In the position detection mechanism also, the above-mentioned monitor mechanism used in the insertion-strength restriction mechanism may be employed. According to the position detection mechanism, the distance from the robot 1 to an object may be measured by detecting a contact state of the push rod 37 with the object when the robot 1 is transferred. The contact state of the push rod 37 with the object may be easily detected by the change in the state shown in FIG. 5A to the state shown in FIG. 5B.

The moving distance of the robot 1 may be measured (or calculated) by monitoring the driving pulse for the robot 1. The circuit used for measuring the moving distance of the robot 1 is well known in the prior art and the explanation thereof will be omitted.

First, a method for measuring the height direction with respect to the robot 1 and the matrix switch board based on the output information from the photoelectric switch 40 will be explained. After initializing the current position of the robot 1, the robot 1 is moved to the matrix switch board 2. When the push rod 37 touches the matrix switch board 2, the output of the photoelectric switch 40 is changed to H-level from L-level as explained above. The number of the driving pulses required for the movement of the robot 1 till the output of the photoelectric switch 40 is changed to H-level corresponds to the distance between the initial position of the robot 1 and the matrix switch board 2. Likewise, the distance between the robot 1 and an object on the matrix switch board 2 may be measured.

Next, a method for detecting a position of an object on the matrix switch board based on the output information from the photoelectric switch 40 will be explained.

Figure 7:
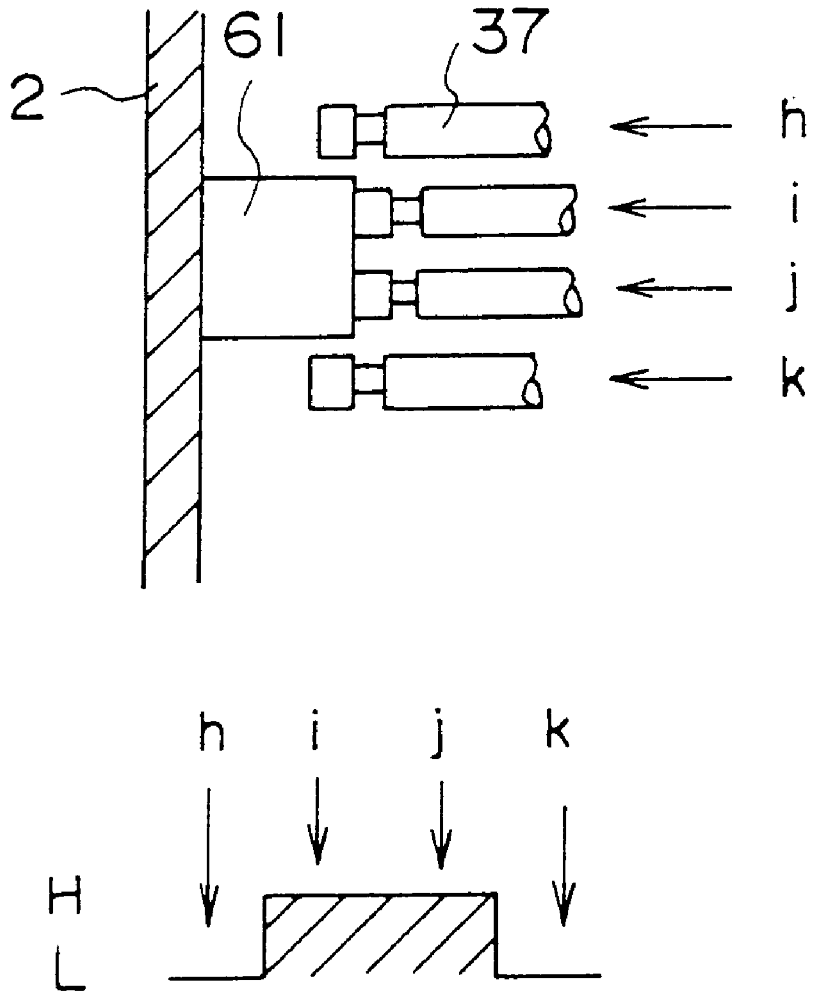
FIG. 7 is a diagram for explaining a position detection method for an object on a matrix switch board.

FIG. 7 is a diagram for explaining a position detection method for an object on the matrix switch board. In FIG. 7, the output waveform of the photoelectric switch 40 is shown in accordance with the movement of the push rod 37.

As shown in FIG. 7, the robot 1 is moved straightforward with a short pitch in the region of an arbitrary object provided on the matrix switch board. Every time the robot 1 moves with a predetermined pitch, the push rod 37 is moved toward the object a predetermined distance. At this time, the presence of the object may be detected when change in the output level of the photoelectric switch 40 is detected. Also, by moving the robot 1 in a cross shape on the object, it is possible to measure the size and the center point of the object.

As shown in FIG. 4, at least two standard pins 61 are provided around the through-hole 83 instead of the standard marks used in the conventional position detection mechanism. The through-hole 83 and the hole for the standard pins 61 may be simultaneously formed and their positional relationship may be determined precisely.

According to the connection pin insertion/extraction device of the present invention, the position of each of the standard pins 61 may be accurately measured by using the above-mentioned position detection mechanism and contacting the standard pin 61 by the push rod 37. Thus, the position of a specific through-hole 83 may also be accurately determined.

Particular to the position detection mechanism of the connection pin insertion/extraction device of the present invention, the position of an object may be detected using the push rod 37 which is located on a central axis extended from the handling mechanism. Thus, an error in distance may be eliminated between the optical sensor and the handling mechanism associated with the conventional connection pin insertion/extraction device in which the optical sensor is not located on the central axis of the handling mechanism. Therefore, the connection pin insertion/extraction device of the present invention may perform the measuring operation of the position of an object more accurately.

Next, a method for detecting a failure of an inserting/extracting operation of the connection pin based on the output information of the photoelectric switch 40 will be explained. In this method, the distance in a height direction of the robot 1 at which the output signal of the photoelectric switch 40 is changed is stored in a memory in advance. When the failure of the inserting/extracting operation of the connection pin is caused, the position of the robot 1 at which the output signal of the photoelectric switch 40 is changed is different from the one stored beforehand.

According to the above method, when the above-mentioned shift in position of the robot 1 at which the output signal of the photoelectric switch 40 is changed is observed, it is assumed that the operation was not successful. For instance, when the metallic pins 42 of the connection pin 3 are not correctly inserted in the corresponding through-holes 83 in the inserting operation, the output signal of the photoelectric switch 40 is changed to H-level from L-level before the robot 1 reaches the predetermined position. Thus, the inserting operation may be determined to be a failure.

As mentioned above, according to the connection pin insertion/extraction device of the present invention, it is possible to form the inserting-strength restriction mechanism and the position detection mechanism (optical sensor), both of which are additionally provided with the conventional connection pin insertion/extraction device, in the same monitor mechanism. Also, a part of the monitor mechanism may be included in the handling mechanism. Therefore, the number of construction parts for the device may be decreased and the manufacturing cost of the device may be lowered. Moreover, the size of the connection pin insertion/extraction device may be reduced.

Further, since the insertion-strength restriction mechanism and the position detection mechanism are formed along substantially the same axis of the handling mechanism, the transfer operation of the insertion force may be efficiently performed without having a loss and the error associated with the position detection operation may be reduced.

In addition, the switch which may be used in the monitor mechanism of the connection pin insertion/extraction device is not restricted to the photoelectric switch 40.

Figure 8A:
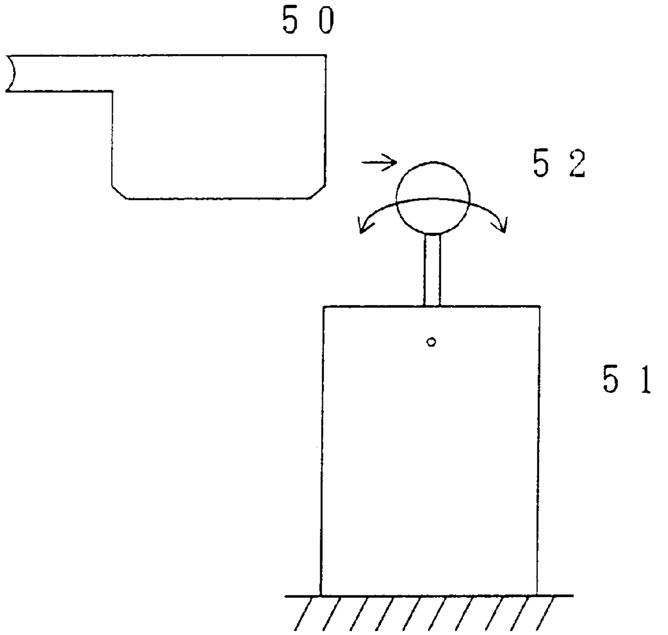
FIG. 8A is a diagram showing a second embodiment of the detection portion of the monitor mechanism.
Figure 8B:
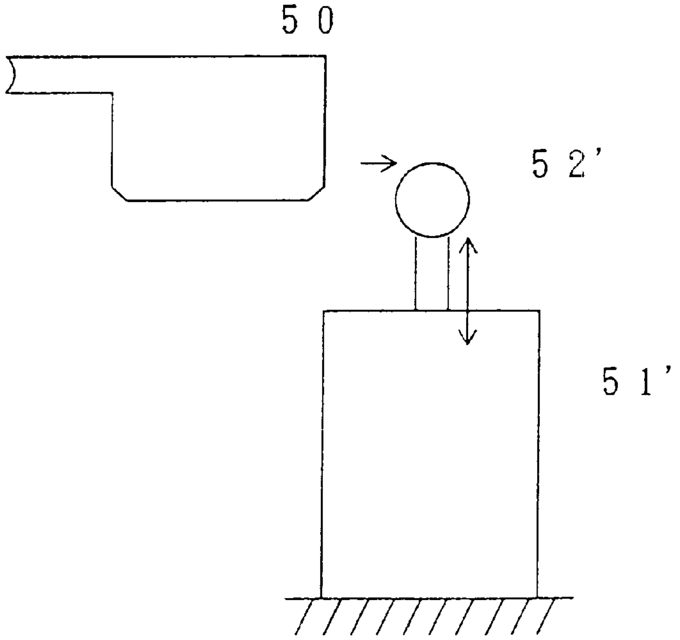
FIG. 8B is a diagram showing a third embodiment of the detection portion of the monitor mechanism.

FIG. 8A is a diagram showing a second embodiment of the detection portion of the monitor mechanism and FIG. 8B is a diagram showing a third embodiment of the detection portion of the monitor mechanism. In FIG. 8A, the detection portion is comprised of a dog 50 and a mechanical switch 51 instead of the photoelectric switch 40. The dog 50 is fixed to an end portion of the flange 37*a* of the push rod 37.

In the operation of the detection portion, the push rod 37 moves in a right direction and the output signal of the switch 51 is change to H-level from L-level when the dog 50 pushes down a knob 52 of the switch 51 in the right direction. When the push rod 37 further moves in the right direction and the dog 50 completely passes over the knob 52, the knob 52 is returned to the original position and the output signal of the switch 51 is changed to L-level from H-level. Accordingly, the dog 50 and the switch 51 may operate in the same manner as the masking plate 39 and the photoelectric switch 40.

Also, although the knob 52 is pushed down in the right or left direction in the above-mentioned switch 51, it is possible to employ a knob 52' which moves in the up and down directions as shown in FIG. 8B.

Figure 9B:
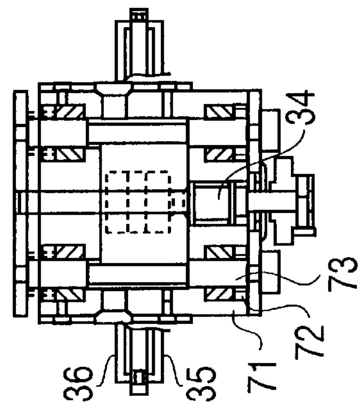
FIG. 9B is a diagram showing a front view of the device shown in FIG. 9A.
Figure 9A:
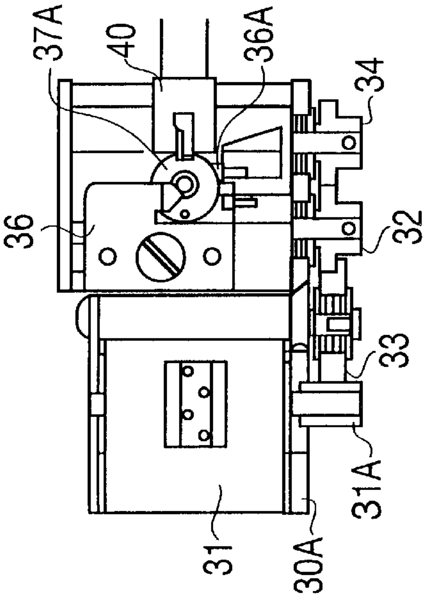
FIG. 9A is a diagram showing a side view of the connection pin insertion/extraction device according to the present invention.
Figure 9C:
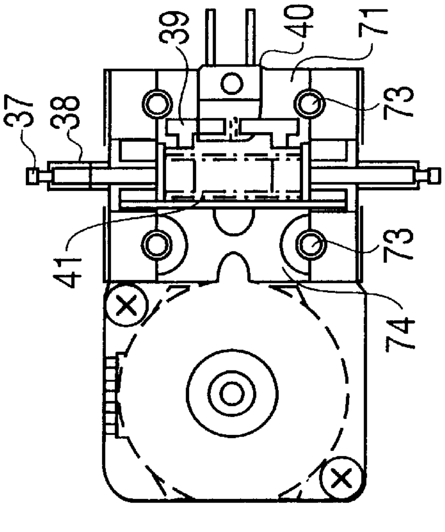
FIG. 9C is a diagram showing a top view of the device shown in FIG. 9A.

FIG. 9A through 9C show an embodiment of a connection pin insertion/extraction device according to the present invention. FIG. 9A is a diagram showing a side view of the connection pin insertion/extraction device, FIG. 9B is a diagram showing a front view of the device and FIG. 9C is a diagram showing a top view of the device.

According to the embodiment shown in the figures, the rotary driving force generated by the motor 31, which is fixed to the frame 30*a* of the handling mechanism 30, is transferred to the screw shafts 32 and 34 via the pinion 31*a* and the idler gear 33. Sliders 71 and 74 in which the screw shafts 32 and 34 are driven, respectively, move along a shaft 73 as a guide and open the corresponding hooks 36 and 35, each of which is fixed to the sliders 71 and 74, respectively. The above-explained handling mechanism, insertion-strength restriction mechanism and position detection mechanism are used in the connection pin insertion/extraction device.

The present invention is not limited to the above embodiments, and variations and modifications may be made without departing from the scope of the present invention.

What is claimed is:

1. A connection pin handling device comprising:

first and second sleeves provided on a common axis and having corresponding first and second inlets disposed respectively at first and second opposite sides of the connection pin handling device, a selected one of the first and second inlets being alignable with a selected connection pin disposed at a corresponding side of the connection pin handling device;

first and second push rods slidably mounted for movement along the common axis in said first and second sleeves, respectively, to engage, by a selected one of the first and second push rods, a selected, aligned connection pin disposed at the respective, corresponding side of the connection pin handling device;

a spring, disposed between said first and second push rods, exerting an insertion force on a selected one of the first and second push rods and the selected push rod thereby applying a force to, and moving, the selected and engaged, aligned connection pin; and said connection pin handling device selectively performing an insertion or an extraction operation on the selected and engaged, aligned connection pin.

2. The connection pin handling device as claimed in claim 1, further comprising first and second hooks disposed in surrounding relationship relative to said axis respectively at the first and second opposite sides of said device, each said hook being selectively operable to hold a corresponding said connection pin.

3. The connection pin handling device as claimed in claim 2, wherein said first and second hooks are formed as one member which moves in parallel in a direction transverse to said axis and performs a selective opening and closing operation on the first and second opposite sides of said connection pin handling device.

4. The connection pin handling device as claimed in claim 3, further comprising:

a detector which detects a sliding distance of said first and second push rods, said detection portion including:

a first member which is fixed to a back portion of said first push rod;

a second member which is fixed to a back portion of said second push rod;

a first circuit which outputs respective, different signals in accordance with the movement of one of said first member and said second member;

sliding movement of one of said push rods, to push a corresponding said connection pin, being stopped by a respective signal from said first circuit when said push rod is moved a first predetermined distance; and a physical presence of an object is detected by a signal from said first circuit when said push rod is moved a second predetermined distance after said push rod contacts said object.

5. The connection pin handling device as claimed in claim 4, wherein:

said first and second sleeves, said first and second push rods, said spring, and said first and second hooks form a connection pin handling mechanism; and said first and second push rods, said spring and said detector form a monitor mechanism which monitors an insertion force of said first and second push rods and a presence of said object, said connection pin handling mechanism and said monitor mechanism being disposed substantially on the common axis.

6. The connection pin handling device as claimed in claim 4, wherein:

each of said first member and said second member is formed of a masking plate; and said first circuit, included in said detector, comprises a photoelectric switch which, in response to interruption of a light beam selectively by the movement of said first member and the movement of said second member, in accordance with corresponding movement of said first and second push rods, outputs respective, first and second different signals.

7. The connection pin handling device as claimed in claim 4, wherein:

each of said first member and said second member is formed of a dog; and said first circuit, included in said detector, comprises a mechanical switch which, when actuated by the movement of said first member and the movement of said second member in accordance with the movement of the respective first and second push rods, outputs the corresponding first and second different signals.

8. A connection pin handling device, comprising:

first and second sleeves provided on a common axis and having corresponding first and second inlets disposed respectively at first and second opposite sides of the connection pin handling device, a selected one of the first and second inlets being alignable with a selected connection pin disposed at a corresponding side of the connection pin handling device;

first and second push rods slidably mounted for movement along the common axis in said first and second sleeves, respectively, to engage, by a selected one of the first and second push rods, a selected, aligned connection pin disposed at the corresponding side of the connection pin handling device, a resilient coupling extending between the first and second push rods;

first and second members affixed to corresponding back portions of said first and second push rods, respectively, and a first circuit which outputs a first detection signal in accordance with detecting movement of one of said first and second members responsive to movement of said respective one of said push rods;

movement of the selected one of said first and second push rods and resultant pushing of said selected and engaged, aligned connection pin being stopped by the first detection signal output from said first circuit when said selected push rod is moved a first predetermined distance; and a presence of an object being detectable by a second detection signal output from said first circuit when said selected push rod is moved a second predetermined distance after said selected push rod contacts said object.

9. The connection pin handling device as claimed in claim 8, wherein:

each of said first and second members comprises a masking plate; and said first circuit comprises a photoelectric switch which, in response to interruption of a light beam by movement of either of said first and second members, in accordance with said movement of said respective one of said push rods, outputs said first detection signal.

10. The connection pin handling device as claimed in claim 8, wherein:

each of said first and second member is formed of a dog; and said first circuit comprises a mechanical switch which, when actuated by movement of either of said first and second member in accordance with ad movement of said respective one of said push rods, outputs said first detection signal.

11. The connection pin handling device as claimed in claim 8, further comprising first and second hooks disposed in surrounding relationship relative to said axis respectively at the first and second opposite sides of said device, each said hook being selectively operable to hold a corresponding said connection pin.

12. The connection pin handling device as claimed in claim 11, wherein:

said first and second sleeves, said first and second push rods, said resilient coupling, and said first and second hooks form a connection pin handling mechanism; and said first and second push rods, said resilient coupling, and said first circuit form a monitor mechanism which monitors an insertion force of each of said push rods and a presence of said object, said connection pin handling mechanism and said monitor mechanism being disposed substantially on the common axis.

* * * * *

UNITED STATES PATENT AND TRADEMARK OFFICE

CERTIFICATE OF CORRECTION

PATENT NO. : 6,021,561

DATED : Ferbruary 8, 2000

INVENTOR(S) : Koichi SHIMAMURA et al.

It is certified that error appears in the above-identified patent and that said Letters Patent is hereby corrected as shown below:

Col. 18, line 46, change "member" to --members-- and change "ad" to --said--.

Signed and Sealed this

Seventh Day of November, 2000

Attest:

Q. TODD DICKINSON

*Attesting Officer*

*Director of Patents and Trademarks*